US006114621A

United States Patent [19]

Tachino et al.

[11] Patent Number: 6,114,621
[45] Date of Patent: *Sep. 5, 2000

[54] PHOTOMULTIPLIER WITH MAGNETIC SHIELDING CASE

[75] Inventors: Masumi Tachino; Hidehiro Kume; Suenori Kimura; Takashi Goto, all of Hamamatsu, Japan

[73] Assignee: Hamamatsu Photonics K.K., Hamamatsu, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/924,651

[22] Filed: Sep. 5, 1997

[30] Foreign Application Priority Data

Sep. 6, 1996 [JP] Japan .................................... 8-237018

[51] Int. Cl.[7] ........................................................ H05K 9/00

[52] U.S. Cl. ........................ 174/35 R; 257/680; 257/681; 257/659; 257/660; 361/800; 361/816; 361/818; 250/216

[58] Field of Search .................................... 257/680, 681, 257/659, 660; 174/35 R; 361/800, 816, 818, 861; 250/216

[56] References Cited

U.S. PATENT DOCUMENTS

| | | | |
|---|---|---|---|
| 3,567,948 | 3/1971 | Oke et al. | 250/216 |
| 4,152,745 | 5/1979 | Eul | 361/146 |
| 5,130,531 | 7/1992 | Ito et al. | 250/216 |

FOREIGN PATENT DOCUMENTS

| | | |
|---|---|---|
| 0 571 201 | 11/1993 | European Pat. Off. . |
| 0 722 182 | 7/1996 | European Pat. Off. . |
| 1547659 | 11/1968 | France . |
| 58-45524 | 3/1983 | Japan . |
| 6-11572 | 1/1994 | Japan . |
| 6-109635. | 4/1994 | Japan . |

OTHER PUBLICATIONS

"Photomultiplier tubes, Hamamatsu Photonics Catalogue" Aug. 1995, Cat. No. TPMO 0002E04, Japan XP002095966.

*Primary Examiner*—William A. Cuchlinski, Jr.
*Assistant Examiner*—Ronnie Mancho
*Attorney, Agent, or Firm*—Pillsbury Madison & Sutro LLP

[57] ABSTRACT

The present invention relates to a magnetic shielding case comprising a structure for improving the uniformity in light receiving sensitivity of a phomultiplier while maintaining sufficient magnetic shielding function, and a light detecting apparatus including this magnetic shielding case. This apparatus comprises a photomultiplier and a magnetic shielding case accommodating the photomultiplier. In particular the magnetic shielding case comprises a housing having an opening for transmitting therethrough light to be detected which is directed to the photomultiplier; a lens element for guiding the light to be detected into an effective region on a photocathode; and a positioning structure for placing the photomultiplier at a desired position with respect to the lens element.

8 Claims, 14 Drawing Sheets

PHOTOMULTIPLIER WITH MAGNETIC SHIELDING CASE

BACKGROUND OF THE INVENTION

1. Field of the Invention

The present invention relates to a magnetic shielding case for protecting a photomultiplier from being influenced by magnetic fieldsin order to stabilize the output of the photomultiplier, and a light detecting apparatus which includes the magnetic shielding case and a photomultiplier housed within the magnetic shielding case.

2. Related Background Art

A conventional magnetic shielding case has, in general, the configuration shown in FIG. 1. This magnetic shielding case 100 has a magnetic shielding main body 101 which is cylindrically formed of permalloy having a high permeability. Further, the magnetic shielding main body 101 is provided with a rectangular entrance window 105, which faces a reflection type photocathode 104 disposed within a sealed glass envelope 103 of a side-on type photomultiplier 102. Accordingly, incident light (light to be detected) transmitted through the entrance window 105 of the magnetic shielding case 100 impinges on the photocathode 104, and photoelectrons emitted from the photocathode 104 are multiplied by an electron multiplying section 106 so as to be collected as an output signal at an anode 107.

In general, a photomultiplier of a type in which the distance between the photocathode 104 and a dynode 106*a* in the first stage is long are likely to be influenced by a magnetic field, whereby photoelectrons may deviate from their normal orbits under the influence of the magnetic field, thus lowering the gain. Accordingly, in order to keep the photomultiplier 102 from being influenced by external magnetic fields, the above-mentioned magnetic shielding case 100 has been utilized.

SUMMARY OF THE INVENTION

Having studied the conventional magnetic shielding case 100 and the light detecting apparatus, which includes the magnetic shielding case as well as the photomultiplier, the inventors have found the following problems.

Namely, since the entrance window 105 in the magnetic shielding case 100 is simply formed as an opening, magnetic fields directly influence the output of the photomultiplier 102. Accordingly, in order to improve the magnetic shielding effect of the magnetic shielding case 100, it has been proposed to reduce the size of the entrance window 105 in the magnetic shielding case 100 or enlarge the magnetic shielding case 100 itself so as to separate the photocathode 104 of the photomultiplier 102 and the entrance window 105 of the magnetic shielding case 100 from each other. When the photomultiplier 102 is separated from the entrance window 105, however, the light incident on the photocathode 104 may incur a greater loss, thereby lowering the output signal intensity.

In order to overcome the problems mentioned above, it is an object of the present invention to provide a magnetic shielding case having a structure for improving the uniformity in light receiving sensitivity of the photomultiplier while maintaining a sufficient magnetic shielding function, and a light detecting apparatus including the same.

Specifically, the light detecting apparatus according to the present invention comprises, at least, a photomultiplier and a magnetic shielding case accommodating the photomultiplier. Here, the magnetic shielding case has a sufficient size so that photoelectrons from a photocathode are not influenced by magnetic fields through an entrance window. In particular, the magnetic shielding case comprises a housing for accommodating a photomultiplier, with a side face having a first opening (entrance window) for transmitting therethrough light to be detected which is directed to the photomultiplier; a lens element, transparent to the light to be detected, supported by the housing so as to close the first opening; and a positioning structure for placing the photomultiplier at a predetermined position in the housing so as to define a distance between a photocathode included in the photomultiplier and the lens element.

In the light detecting apparatus according to the present invention, the photomultiplier accommodated in the magnetic shielding case includes a side-on type photomultiplier having a reflection type photocathode inclined with respect to the direction of incidence of the light to be detected and a head-on type photomultiplier having a transmission type photocathode disposed substantially perpendicular to the light to be detected reaches. The lens element functions so as to restrict the incident area on the photocathode, where the light to be detected reaches. In order to reduce the influence of magnetic fields, the entrance window is disposed so as to be sufficiently separated from the photocathode of the photomultiplier accommodated in the magnetic shielding case. Accordingly, in order to obtain a desired light receiving sensitivity, it is important for the entrance window to be provided with the lens element.

In the case where the photomultiplier is a side-on type photomultiplier (i.e., in the case where it has a reflection type photocathode), the structure for positioning the magnetic shielding case comprises: a lid portion, attached to the housing, for defining, together with the housing, a space for accommodating the photomultiplier, the lid portion having an opening for defining a position where the photomultiplier is disposed; and a socket portion, attached to the lid portion so as to close the opening of the lid portion, for supporting the photomultiplier through the opening of the lid portion. Accordingly, by the magnetic shielding case having the thus described lid portion, the distance between the entrance window and the photocathode is accurately defined.

On the other hand, in the case where the photomultiplier is a head-on type photomultiplier (i.e., in the case where it has a transmission type photocathode), the housing comprises a second opening, opposing the entrance window, for accommodating the photomultiplier, and an inner wall of the housing and an opening end defining the second opening are included in the positioning structure. Also in this case, the distance between the entrance window and the photocathode is accurately defined.

When a side-on type photomultiplier is applied to the light detecting apparatus according to the present invention, the light to be detected that is incident on the lens element attached to the entrance window in the housing is collected at an effective region of the reflection type photocathode of the photomultiplier while being converged, and photoelectrons are generated from this effective region. The effective region is not only a highly sensitive area in the whole surface of the photocathode but also an area where stray electrons are less likely to occur, and is located near the dynode in the first stage. Since the place where the photoelectrons occur are restricted to a small area, i.e., effective region, fluctuations among times at which the respective photoelectrons occur are small. Also, since the photoelectrons are generated at places close to each other, fluctuations in electron transit time can be greatly reduced. Also, even when the position of light incident on the lens element is somewhat changed due to a small fluctuation in the position of a light source fluctuations in the output from the anode can become very small, since the light is collected at the effective region for the photoelectrons, together with little fluctuation in electron transit time . Further, even when the photocathode is not strictly positioned with respect to an object, light can be collected at an appropriate position of the photocathode due to the condensing action of the lens element. Consequently, it becomes easy to align the object and the photocathode with respect to each other in terms of optical axis. A little deviation in their optical axes hardly affects the uniformity in light receiving sensitivity. Such a condensing action is effective, in particular, for weak light such as chemiluminescence, bioluminescence, or fluorescence, thereby contributing to improvement in S/N. Further, even when the magnetic shielding case is enlarged so that the distance between the entrance window and the photocathode is increased in order to enhance the magnetic shielding effect, the loss in the light incident on the photomultiplier becomes so small that weak light can be detected easily even in a strong magnetic field due to the condensing action of the lens element.

In the case of the side-on type photomultiplier, the lens element preferably comprises a cylindrical lens. Here, the "cylindrical lens" refers to a lens having at least one surface formed like a part of a cylinder and yielding astigmatism such that a point of light extends into a line. When such a cylindrical lens is employed, the light to be detected can be collected in slit form on the effective region of the photocathode, thus elongating the form of the collected light on the photocathode in its longitudinal direction so as to match the long form of the photocathode. Accordingly, the form of the collected light can match the long form of the dynode in each stage, thus allowing the electron multiplying region of each dynode to be utilized efficiently. Also, it becomes unnecessary to perform an operation for inserting a slit plate between the object and the entrance window of the magnetic shielding case, and the axial alignment f the slit in the slit plate with the photocathode.

Also, in both cases of the side-on and head-on type photomultipliers, a hemispherical lens may be used as the lens element. Since the light to be detected can be collected onto the photocathode in spot form, the use of such a hemispherical lens is effective for detecting weak light in particular.

The magnetic shielding case further comprises the lid portion for closing the photomultiplier-inserting slot (second opening) formed in the housing. This lid portion has an opening for defining the position where the photomultiplier is disposed, and stem pins of the photomultiplier are coupled to the socket portion through this opening. When such a positioning structure is employed, the photomultiplier can be disposed at a predetermined position within the magnetic shielding case accurately and easily. Also, by means of the lid portion, the photomultiplier can be substantially closed within the magnetic shielding case, thus allowing the magnetic shielding effect to be further enhanced.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

In the following, preferred embodiments of the magnetic shielding case a light detecting apparatus which includes the magnetic shielding case and a photomultiplier housed within the magnetic shielding case according to the present invention will be explained in detail with reference to FIGS. 2 to 17.

Figure 1:
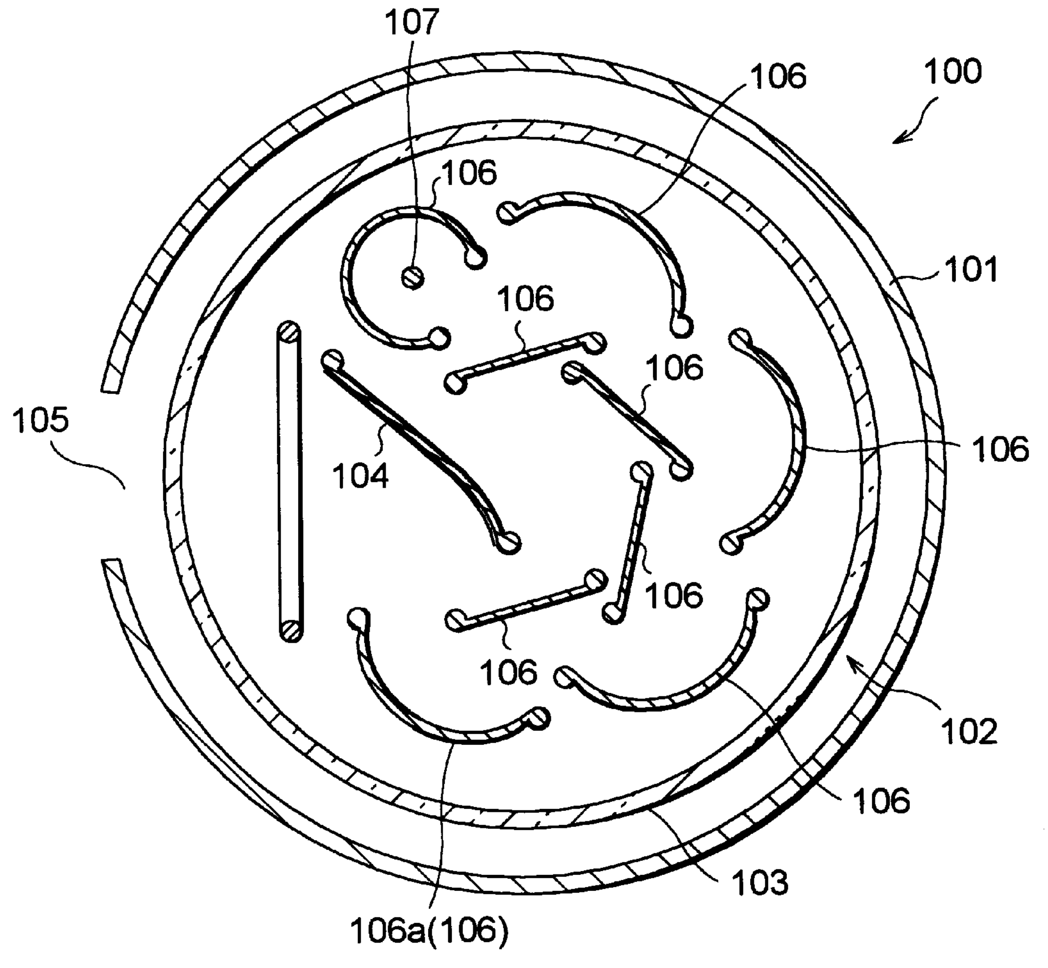
Fig.1 (PRIOR ART)
FIG. 1 is a view showing a cross-sectional configuration of a conventional light detecting apparatus which includes, at least, a photomultiplier and a magnetic shielding case accommodating it.
Figure 2:
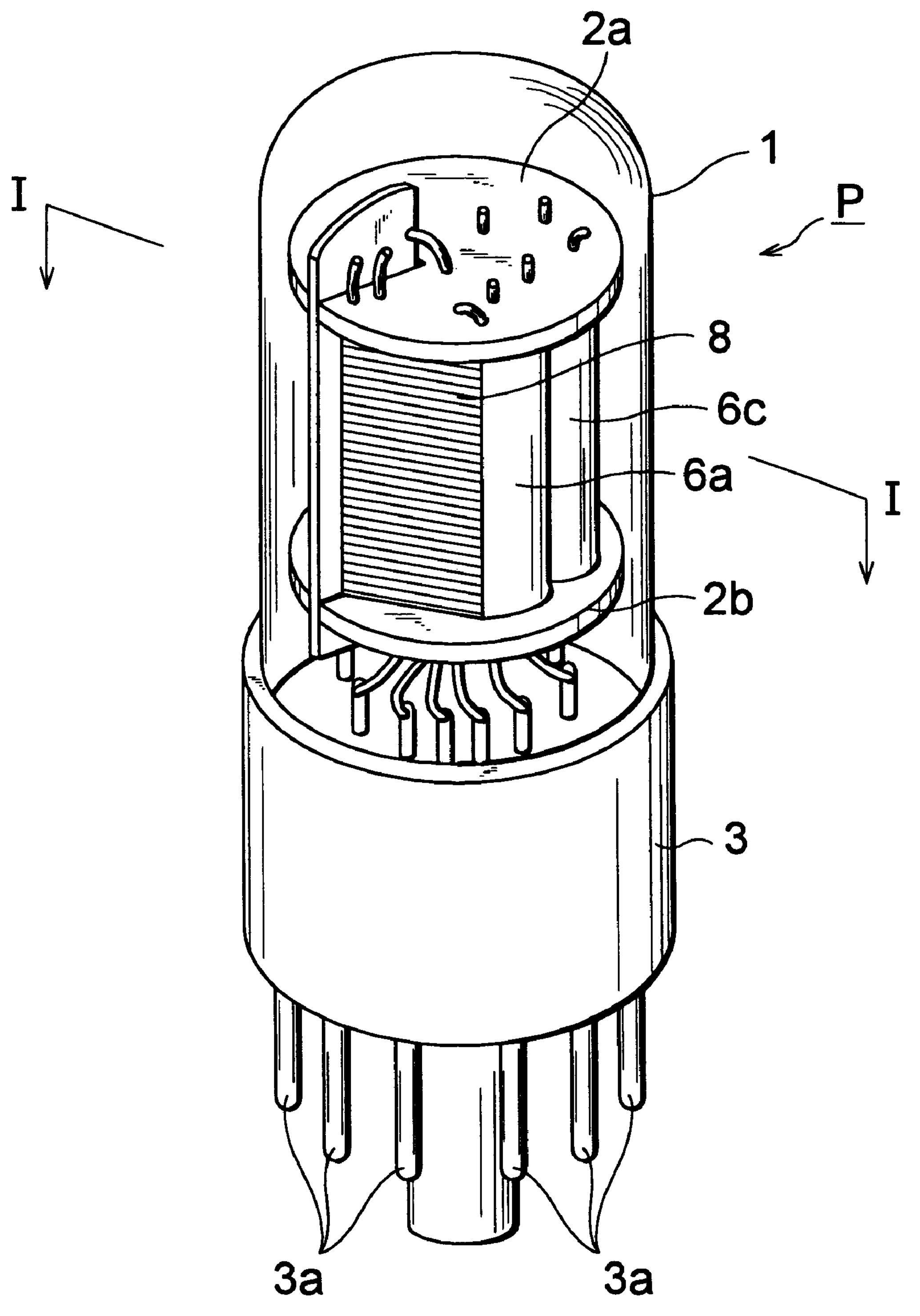
FIG. 2 is a perspective view showing a side-on type photomultiplier which is applicable to a light detecting apparatus according to the present invention.
Figure 3:
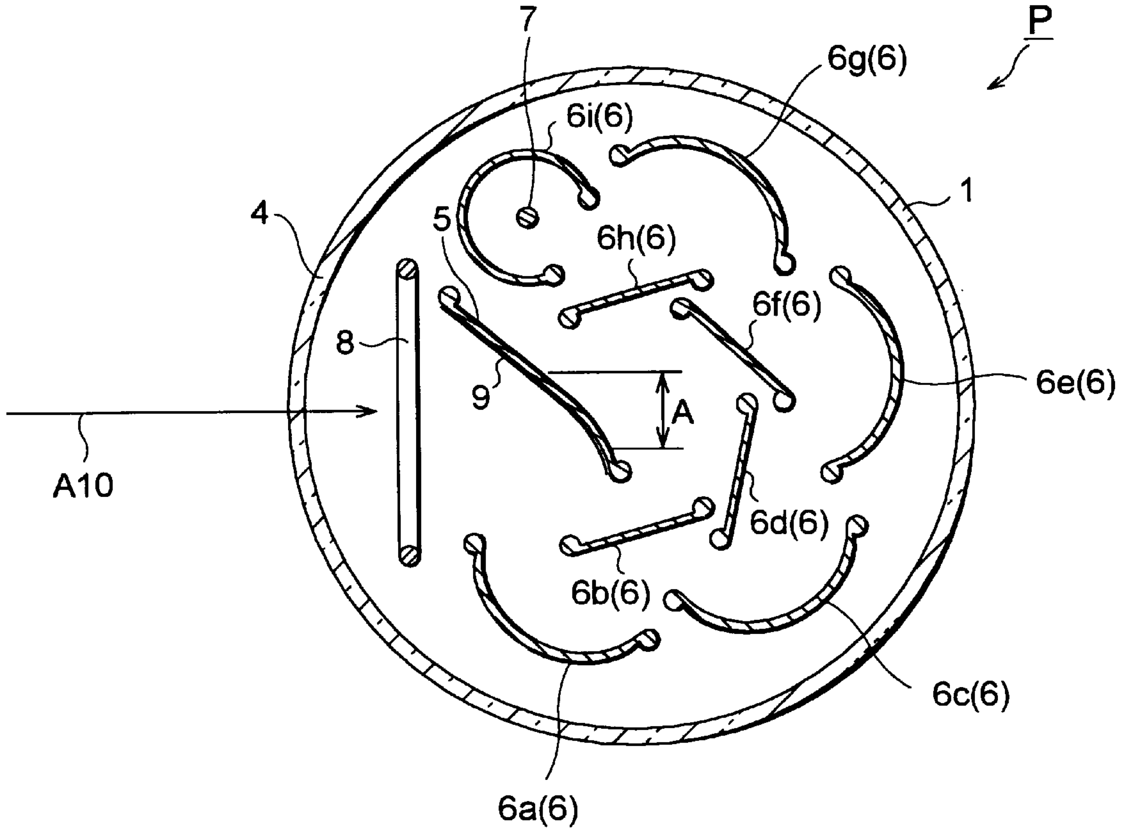
FIG. 3 is a view showing a cross-sectional configuration, taken along line I—I, of the side-on type photomultiplier shown in FIG. 2.

FIG. 2 is a perspective view showing a side-on type photomultiplier to be accommodated in the magnetic shielding case according to the present invention. FIG. 3 is a sectional view, taken along line I—I, of the side-on type photomultiplier shown in FIG. 2. The side-on type photomultiplier P shown in these drawings comprises a sealed envelope 1 which is transparent to light. This sealed envelope 1 is formed as a transparent cylindrical whose upper and lower ends are closed, while comprising borosilicate glass, UV glass, silica glass, or the like. In the sealed envelope 1, a pair of insulator substrates 2*a* and 2*b* made of ceramics or the like are disposed, while various kinds of electrodes are supported between the pair of insulator substrates 2*a* and 2*b*. Secured to the bottom portion of the sealed envelope 1 is a pin base 3 made of a resin. This pin base 3 is provided with a plurality of stem pins 3*a*, by which the various kinds of electrodes are lead to the outside.

As shown in FIGS. 2 and 3, supported by the pair of insulator substrates 2*a* and 2*b* therebetween are a reflection type photocathode 9 inclined by a predetermined angle with respect to the incident direction A10 of light to be detected; an electron multiplying section 6 comprising a plurality of stages of dynodes 6*a* to 6*i* for successively multiplying a photoelectron emitted from the photocathode 9; and an anode 7 for collecting thus multiplied electron as an output signal. Further disposed between the light incident portion 4 and the photocathode 9 is a grid electrode 8 for securely guiding the photoelectron emitted from the photocathode 9 into the dynode 6*a* of the first stage. This grid electrode 8 is set to the same potential as the photocathode 9. Also, the photocathode 9 is formed on an electrode plate 5 and faces the light incident portion 4 of the sealed envelope 1 across the grid electrode 8.

Figure 4:
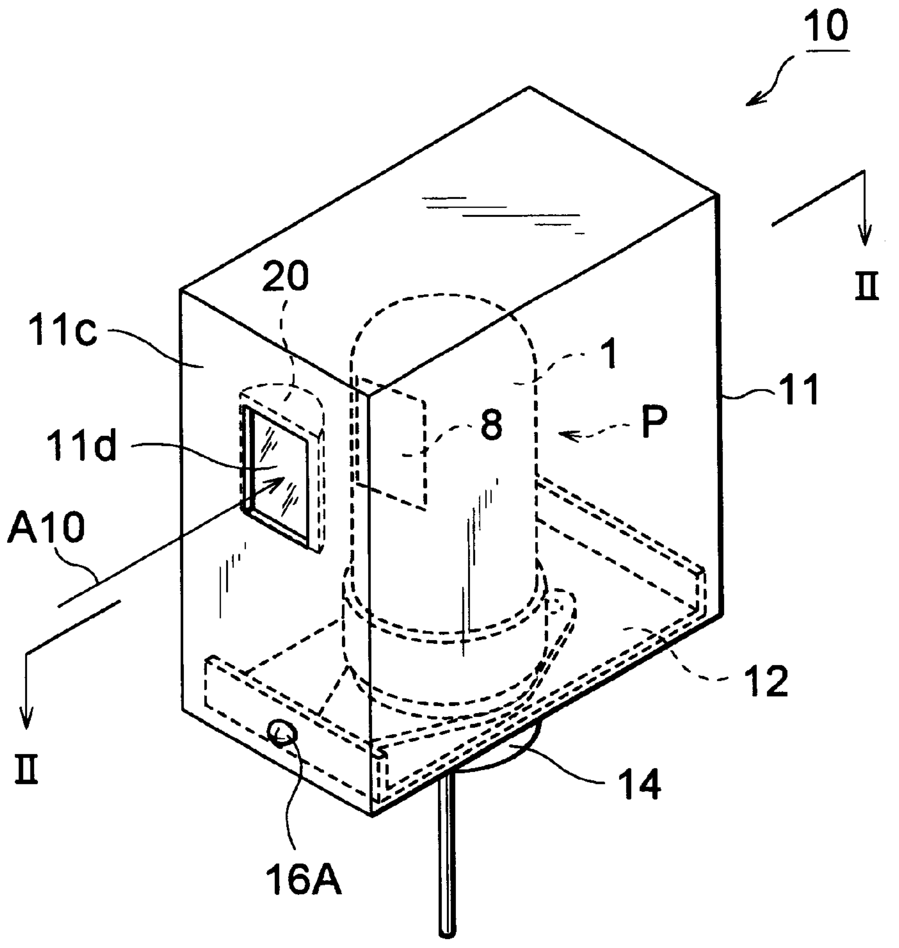
FIG. 4 is a perspective view showing a first embodiment of the light detecting apparatus according to the present invention to which a side-on type photomultiplier is applied (employing a cylindrical lens as its lens element)
Figure 6:
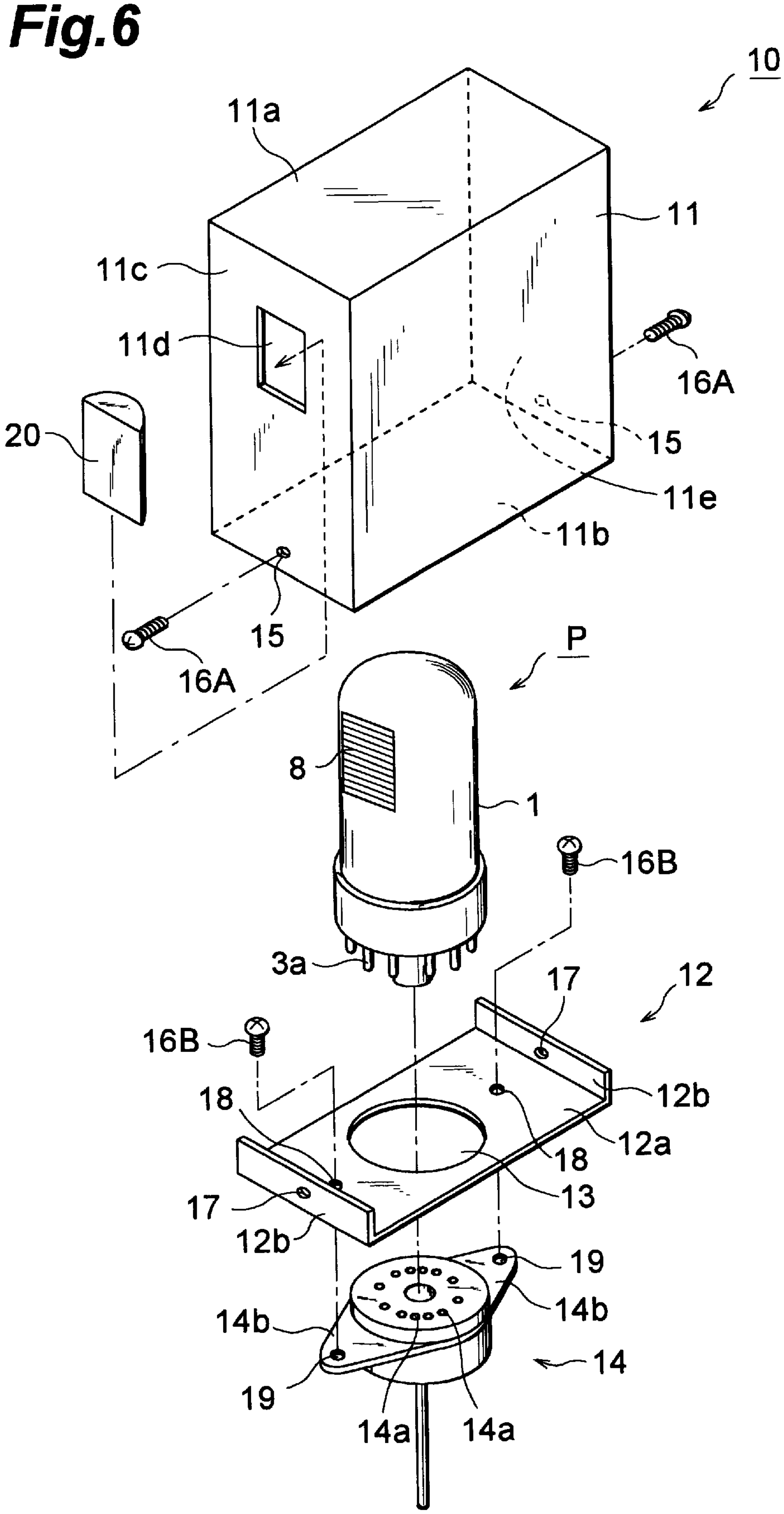
FIG. 6 is a view for explaining assembling steps of the first embodiment of the light detecting apparatus according to the present invention.

FIGS. 4 and 6 show a magnetic shielding case 10 (first embodiment) for protecting the above-mentioned photomultiplier P against external magnetic fields, and a light detecting apparatus including the same. This magnetic shielding case 10 comprises a cuboidal box-shaped housing (magnetic shielding main body) 11 made of permalloy having a high permeability. The upper and lower ends of the housing 11 are respectively provided with a rectangular top plate 11*a* and an open rectangular photomultiplier-inserting slot 11*b*. Also, a through screw hole 15 is formed at the lower end of the housing 11 so as to be utilized when a set screw 16A secures a lid portion 12 which will be explained later.

The magnetic shielding case 10 further comprises the lid portion 12, shaped like a plate, for closing the photomultiplier-inserting slot 11*b*. The lid portion 12 is made of permalloy having a high permeability. The lid portion 12 has a bottom plate 12*a* substantially matching the plane including the photomultiplier-inserting slot 11*b*. Both ends of the bottom plate 12 are provided with bent portions abutting to the lower end of an inner wall face 11*e* (see FIG. 6) of the housing 11. Each bent portion 12*b* is provided with a tapped hole 17. When each tapped hole 17 is aligned with its corresponding through screw hole 15, the lid portion 12 can be secured to the housing 11 with the set screw 16A. Also, the bottom plate 12*a* is provided with a through screw hole 18, which is utilized when a set screw 16B secures a socket portion 14 which will be explained later.

The magnetic shielding case 10 further comprises the socket portion 14 that fits into a circular socket opening 13 formed at the center of the bottom plate 12*a*. The top part of the socket portion 14 is provided with electric connecting holes 14*a* for respectively receiving the stem pins 3*a* of the photomultiplier P. The socket portion 14 has flanges 14*b* radially extending from its peripheral surface. Each flange 14*b* has a tapped hole 19. Accordingly, when each tapped hole 19 is aligned with its corresponding through screw hole 18 of the lid portion 12 while each flange 14*b* is butted against the rear face of the bottom plate 12*a*, the socket portion 14 can be secured to the lid portion 12 with the set screw 16B.

Figure 5:
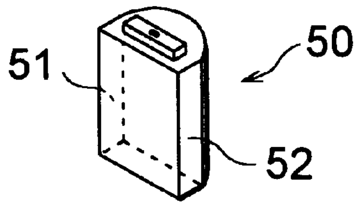
FIG. 5 is a perspective view showing a configuration of a lens element made of a plastic material applicable to the light detecting apparatus shown in FIG. 4.
Figure 7:
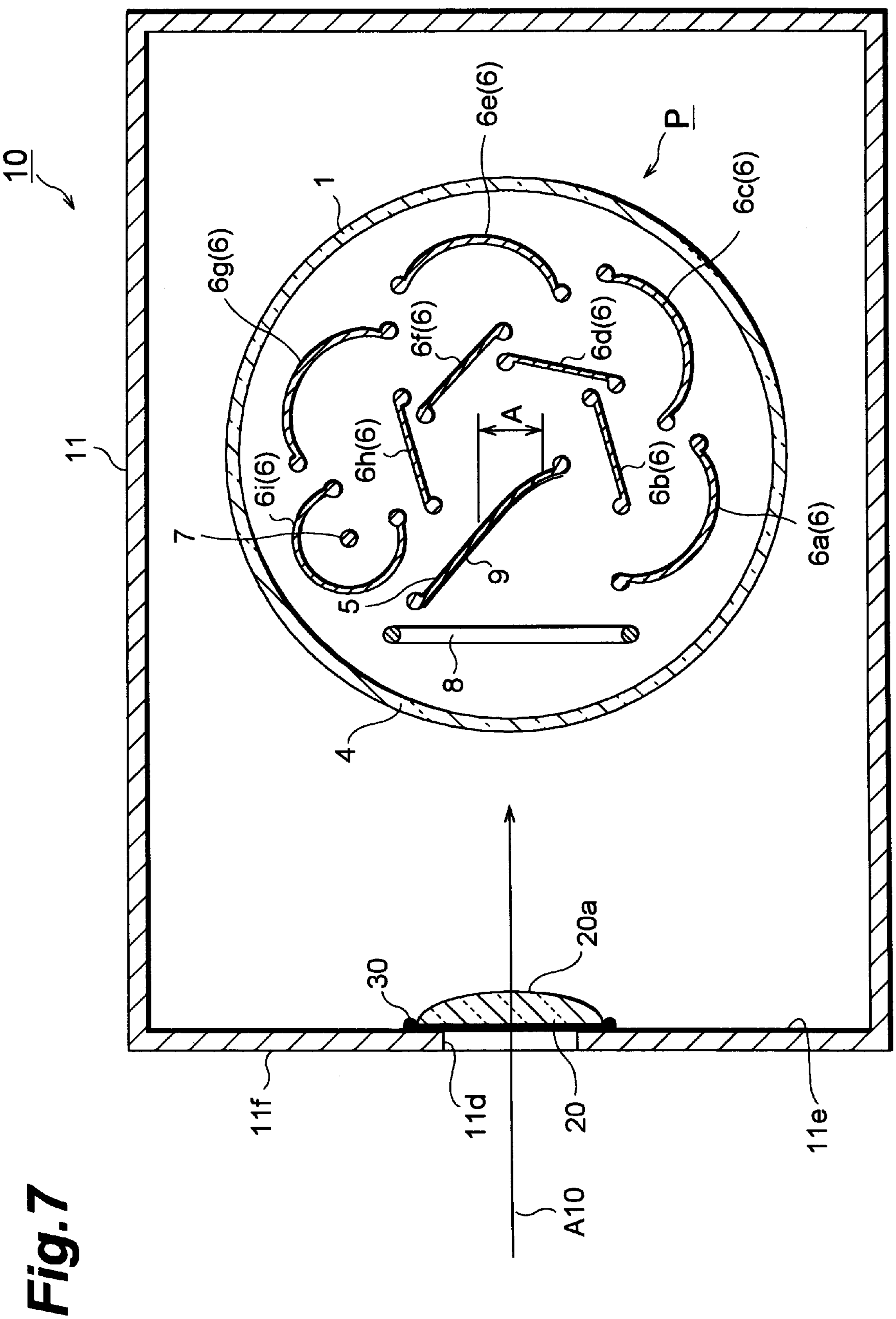
FIG. 7 is a sectional view, taken along line II—II, of the first embodiment of the light detecting apparatus shown in FIG. 4.

In the magnetic shielding case 10, as shown in FIGS. 4 and 7, a front wall 11*c* of the housing 11 is provided with a rectangular entrance window 11*d* facing the photocathode 9 through the light incident portion 4 of the sealed envelope 1. A condenser lens 20 (lens element) made of glass is secured to the housing 11. This condenser lens 20 includes a cylindrical lens having a cylindrically-curved lens surface 20*a*. The condenser lens 20 is secured to the inner wall face 11*e* by means of an adhesive such that the lens surface 20*a* faces the photomultiplier P. Accordingly, the cylindrical lens 20 is prevented from projecting from an outer wall face 11*f* of the housing 11, and the lens surface 20*a* is kept from being damaged during the handling of the magnetic shielding case 10. Here, such a lens element may be made of a plastic material as shown in FIG. 5. The plastic lens element 50 of FIG. 5 has side-cut surfaces 51 and 52 that are formed by cutting both side edges of the lens 50.

In the following, assembling steps for the above-mentioned magnetic shielding case 10 will be explained briefly. First, as shown in FIG. 6, the housing 11 to which the cylindrical lens 20 has been completely bonded and secured is prepared. Then, the stem pins 3*a* of the photomultiplier P are respectively inserted into the electric connecting holes 14*a* in the socket portion 14 secured to the lid portion 12, whereby the photomultiplier P is secured to the lid portion 12. Thereafter, the photomultiplier P is inserted into the housing 11 through the photomultiplier-inserting slot 11*b*, and the tapped holes 17 of the lid portion 12 are aligned with their corresponding through screw holes 15. Thereafter, the set screws 16A are fastened into their corresponding through screw holes 15 and tapped holes 17, whereby the lid portion 12 is secured to the housing 11, thus completing the operation for attaching the photomultiplier P to the magnetic shielding case 10. By this operation, the photomultiplier P is accurately positioned.

Figure 8:
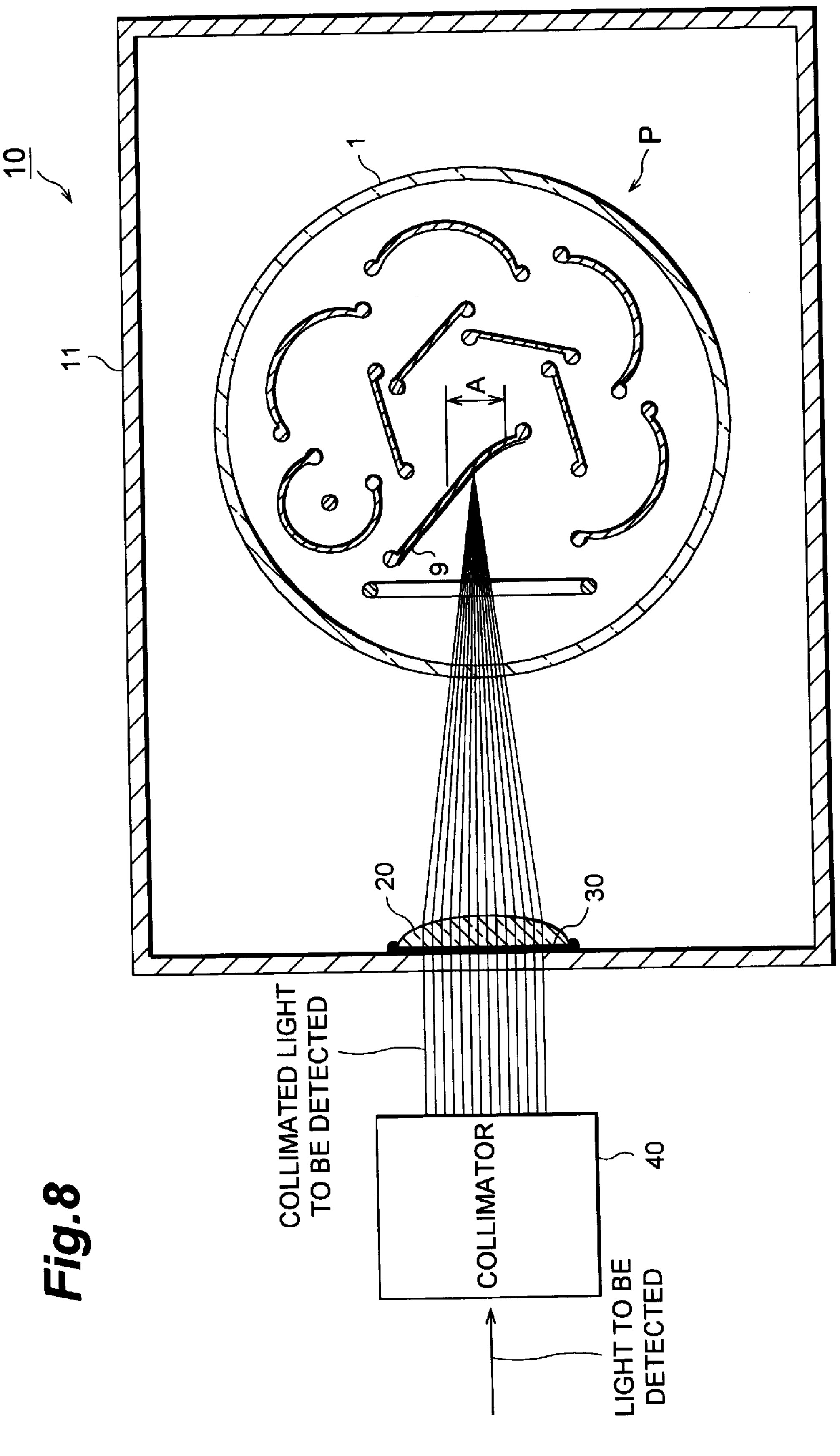
FIG. 8 is a view for explaining a function of the lens member employed in the light detecting apparatus according to the present invention, which corresponds to the sectional view of the first embodiment taken along line II—II in FIG. 4.

Further, the radius of curvature of the lens surface 20*a* of the cylindrical lens 20 is selected such that, as shown in FIG. 8, the light incident on the cylindrical lens 20 substantially forms a focal point in an effective region A of the photocathode 9 of the photomultiplier P. When the cylindrical lens 20 like this is utilized, the light to be detected can be collected into a slit form on the effective region A of the photocathode 9. Thus, the form of collected light on the photocathode 9 is elongated in its longitudinal direction so as to match the long form of the photocathode 9. Accordingly, when the part generating photoelectrons is formed like a long slit, the long electron multiplying region produced by each of the dynodes 6*a* to 6*i* can effectively be utilized.

As shown in FIG. 8, the light detecting apparatus according to the present invention may further comprise a collimator 40 for collimating the light to be detected.

Figure 9:
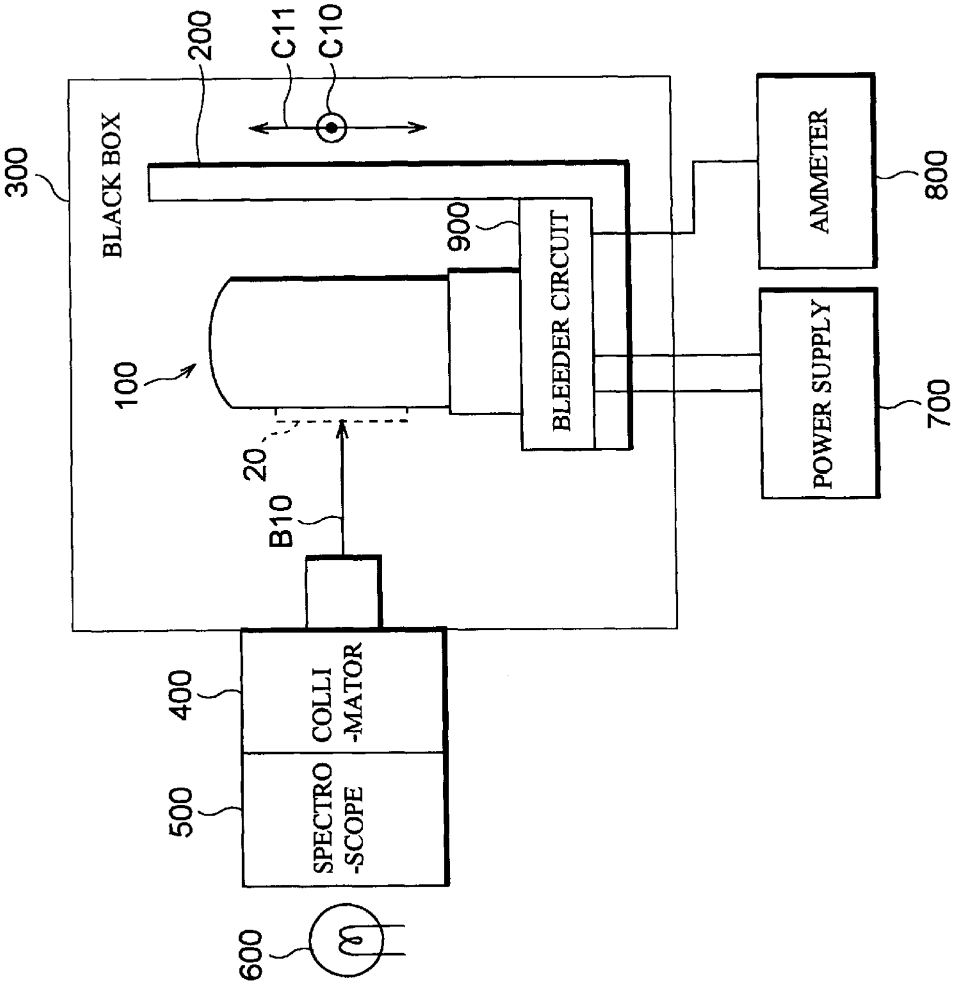
FIG. 9 is a view showing a measurement system for measuring a sensitivity characteristic of the light detecting apparatus according to the present invention.

FIG. 9 is a view showing a measurement system for measuring the uniformity in light receiving sensitivity of a side-on type photomultiplier which is an object to be measured.

The measurement system shown in FIG. 9 comprises, at least, a light source 600; a spectroscope 500 for selecting a light component with a predetermined wavelength from the light emitted from the light source 600; a collimator 400 for collimating the light component selected by the spectroscope 500; a black box 300 accommodating a photomultiplier 100 (including photomultipliers with and without the lens element 20) which is the object to be measured; a stage 200 for relatively moving the object to be measured 100 with respect to a beam B10 emitted from the collimator 400; a power supply 700 for supplying a desired voltage to the object to be measured 100; a bleeder circuit 900 for dividing the voltage supplied from the power supply 700; and an ammeter 800 for detecting the output signal obtained from the anode of the object to be measured 100.

Here, the stage 200 on which the object to be measured 100 is mounted and the bleeder circuit 900 are accommodated in the black box 300. The stage 200 moves the object to be measured 100 in the directions indicated by depicted arrows C10 (directions perpendicular to the paper surface) and in the directions indicated by depicted arrows C11 (directions orthogonal to the directions indicated by C10).

Figure 10:
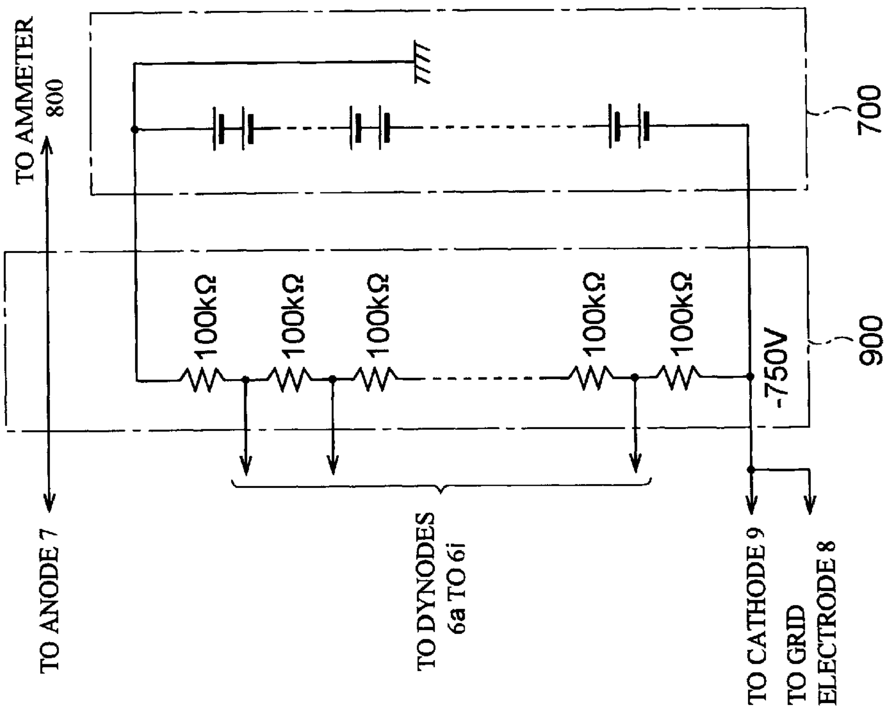
FIG. 10 is a view showing a configuration of a bleeder circuit and power supply in the measurement system of FIG. 9.

As shown in FIG. 10, the bleeder circuit 900 comprises a plurality of resistors connected in series, thereby dividing the voltage supplied from the power supply 700.

Here, the above-mentioned effective region A is, in the whole surface of the photocathode 9, not only an area which has a high sensitivity but also an area where stray electrons are less likely to occur. This effective region A is an area near the dynode 6*a* of the first stage, is positioned on the inner side of the sealed envelope 1, and is far from the grid electrode 8 having the same potential. Namely, as can also be seen from FIG. 8, the effective region A refers to, in the photocathode 9, an area which extends from near the center portion toward the dynode 6*a* of the first stage where the light receiving sensitivity (anode output) in the width directions is not lower than 80%. Here, there are also cases where the effective area A is determined as an area in which the light receiving sensitivity in the width directions is not lower than 90%.

Next, the inventors measured changes in light receiving sensitivity between photomultipliers with and without a condenser lens by using the measurement system shown in FIGS. 9 and 10.

Specifically, the wavelength of the light to be measured was 400 nm, whereas its spot diameter was 1 mm. The condenser lens was a cylindrical lens having a width (in the directions indicated by C10 in FIG. 9) and a length of 28 mm (in the directions indicated by C11 in FIG. 9). Here, the radius of curvature of the lens surface 20*a* of the cylindrical lens used was designed such that the collimated light to be detected could reach into the effective region A.

The scanning pitch of the spot light (having a wavelength of 400 nm and a spot diameter of 1 mm) in the width directions C10 was 1 mm. On the other hand, the scanning pitch of the spot light (having a wavelength of 400 nm and a spot diameter of 1 mm) in the length directions C11 was also 1 mm. By connecting a plurality of 100-kΩ resistors in series, the bleeder circuit 900 equally divides the applied voltage. An output terminal of the anode 7 is connected to the ammeter 800, whereas a voltage of −750 V is applied to the photocathode 9.

Figure 11:
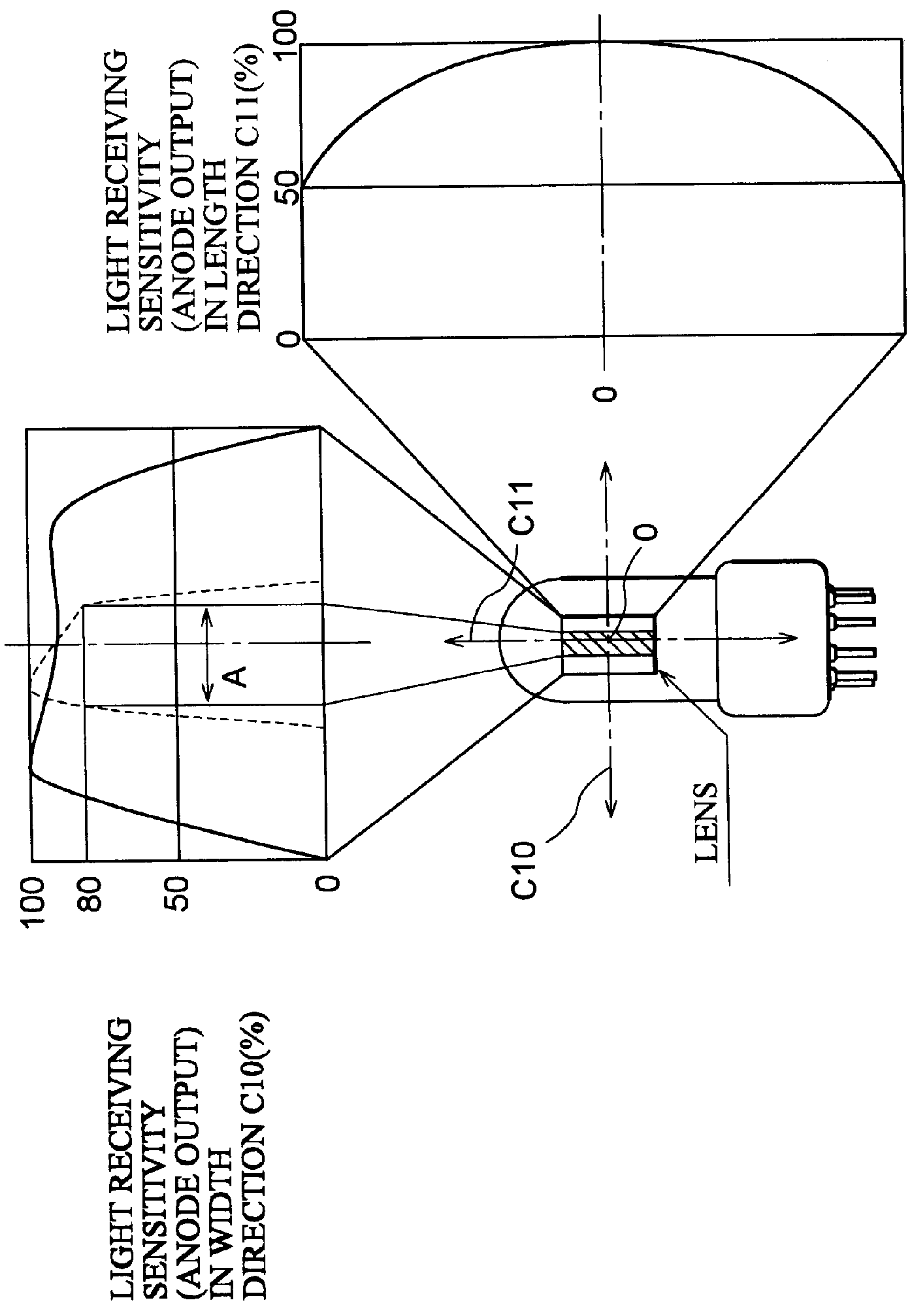
FIG. 11 is a graph showing respective anode outputs of side-on type photomultipliers receiving the light to be detected through and without a lens member measured by the measurement system shown in FIG. 9.
Figure 12:
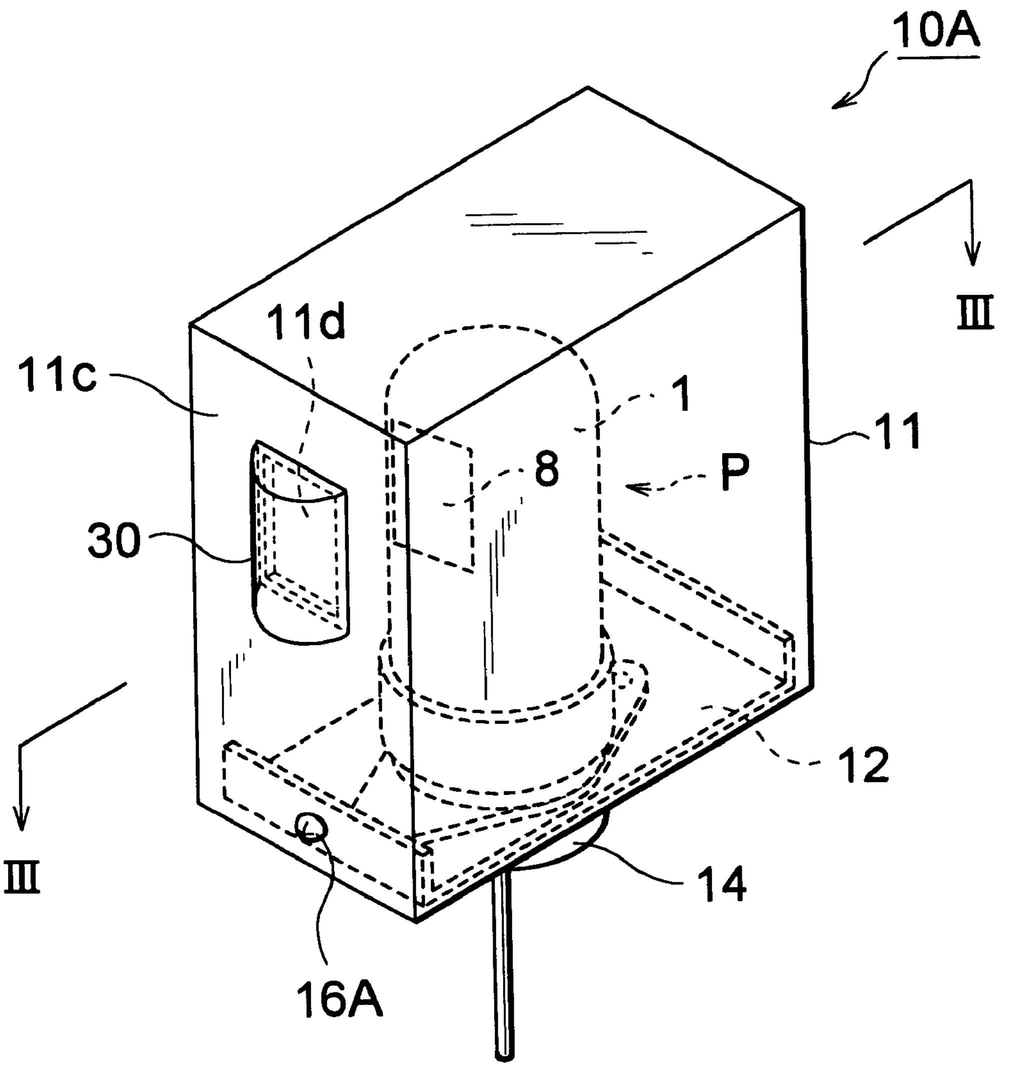
FIG. 12 is a perspective view showing a first modified example of the first embodiment of the light detecting apparatus according to the present invention (in which the lens element (cylindrical lens) is attached to the magnetic shielding case in a manner different from that of FIG. 4)
Figure 13:
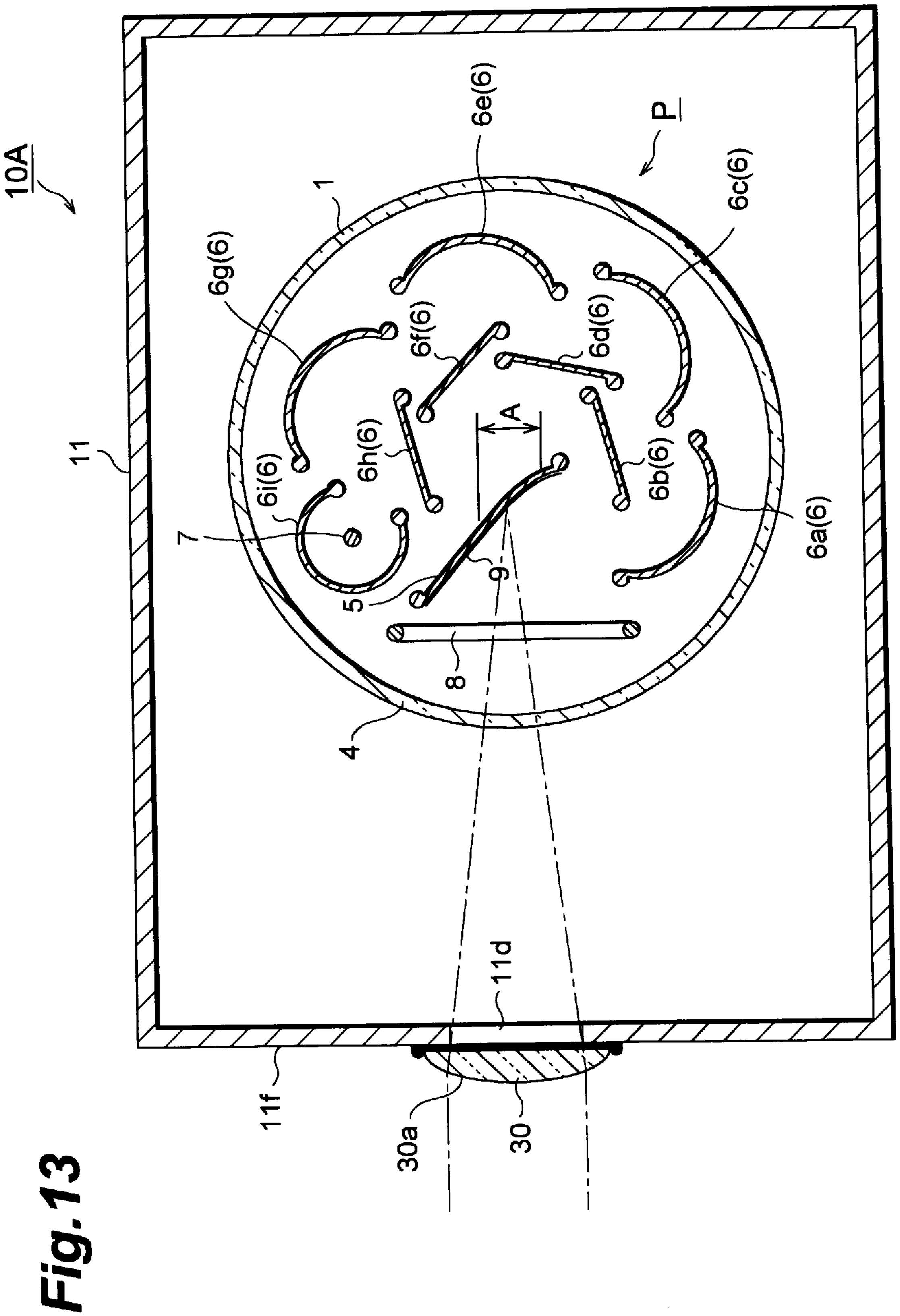
FIG. 13 is a sectional view, taken along line III—III, of the light detecting apparatus shown in FIG. 12.

FIG. 11 shows graphs each showing a relationship between the incident position of the spot light and the anode output measured under the condition mentioned above. In these graphs, solid and dashed lines respectively indicate measured results of the photomultipliers with and without the condenser lens.

As can be seen from the upper-side graph of FIG. 11, the photomultiplier without the condenser lens can hardly measure the light to be detected incident on the outside of the effective region A. In the photomultiplier with the condenser lens, by contrast, a wide range of the light to be detected is guided by the condenser lens along the width directions C10 into the effective region A, thereby improving the uniformity in light receiving sensitivity.

On the other hand, as can be seen from the right-side graph of FIG. 11, due to the forms of the photocathode 9 and dynodes 6*a* to 6*i*, no remarkable difference could be found in the light receiving sensitivity along the length directions C11 between the cases with and without the condenser lens.

The present invention should not be restricted to the first embodiment mentioned above. In a first modified example shown in FIGS. 12 and 13, as with the first embodiment, a condenser lens 30 made of glass is secured to the front wall 11*c* of a magnetic shielding case 10A. The condenser lens 30 is secured to the housing 11 so as to close the rectangular entrance window 11*d* disposed at a position facing the photocathode 9 through the light incident portion 4 of the sealed envelope 1. Also, the condenser lens 30 is a cylindrical lens having a cylindrically-curved lens surface 30*a*. The condenser lens 30 is secured to the outer wall face 11*f* of the housing 11 by means of an adhesive such that the lens surface 30*a* is directed to the outside of the housing 11. Accordingly, the condenser lens 30 can be bonded to the housing 11 from the outside, thus facilitating the positioning and securing of the condenser lens 30. Here, in FIGS. 12 and 13, constituents identical or equivalent to those in the magnetic shielding case 10 of the above-mentioned first embodiment are referred to with marks identical thereto without their explanations being repeated.

Figure 14:
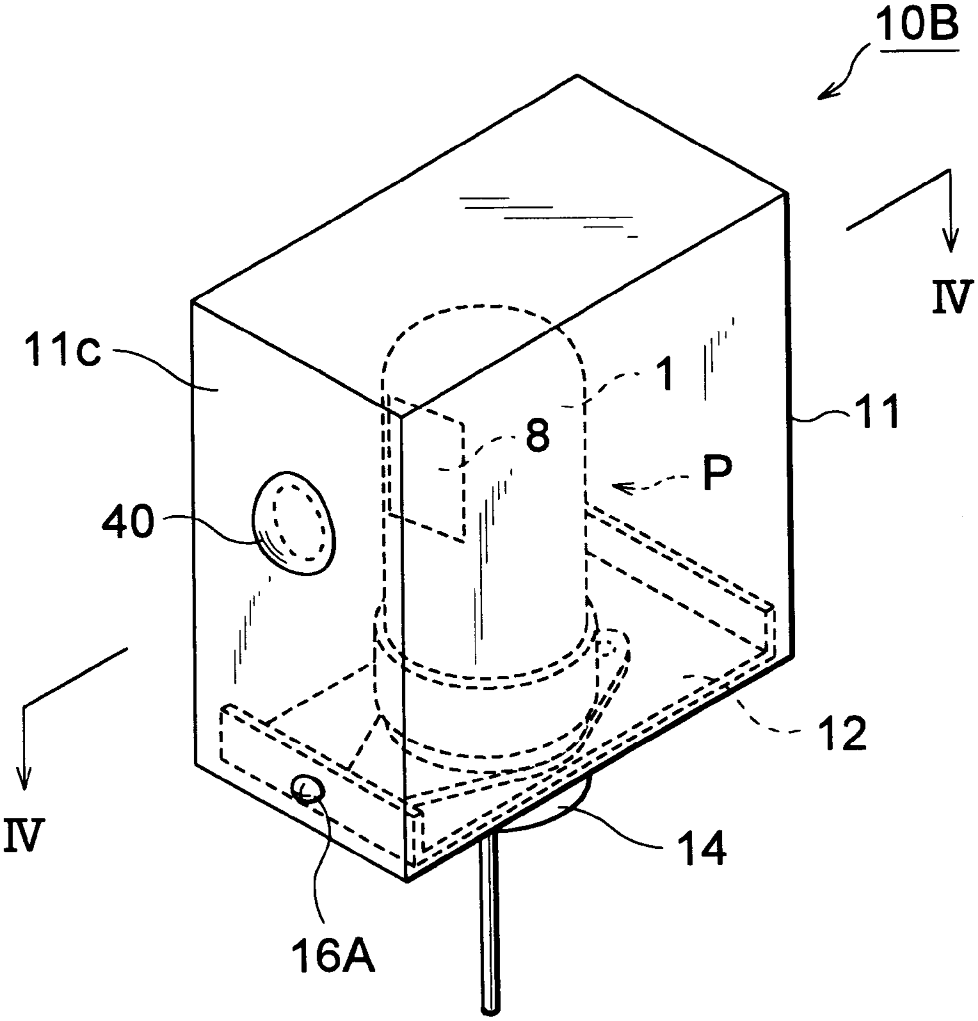
FIG. 14 is a perspective view showing a second modified example of the first embodiment of the light detecting apparatus according to the present invention (in which a hemispherical lens is employed as the lens element)
Figure 15:
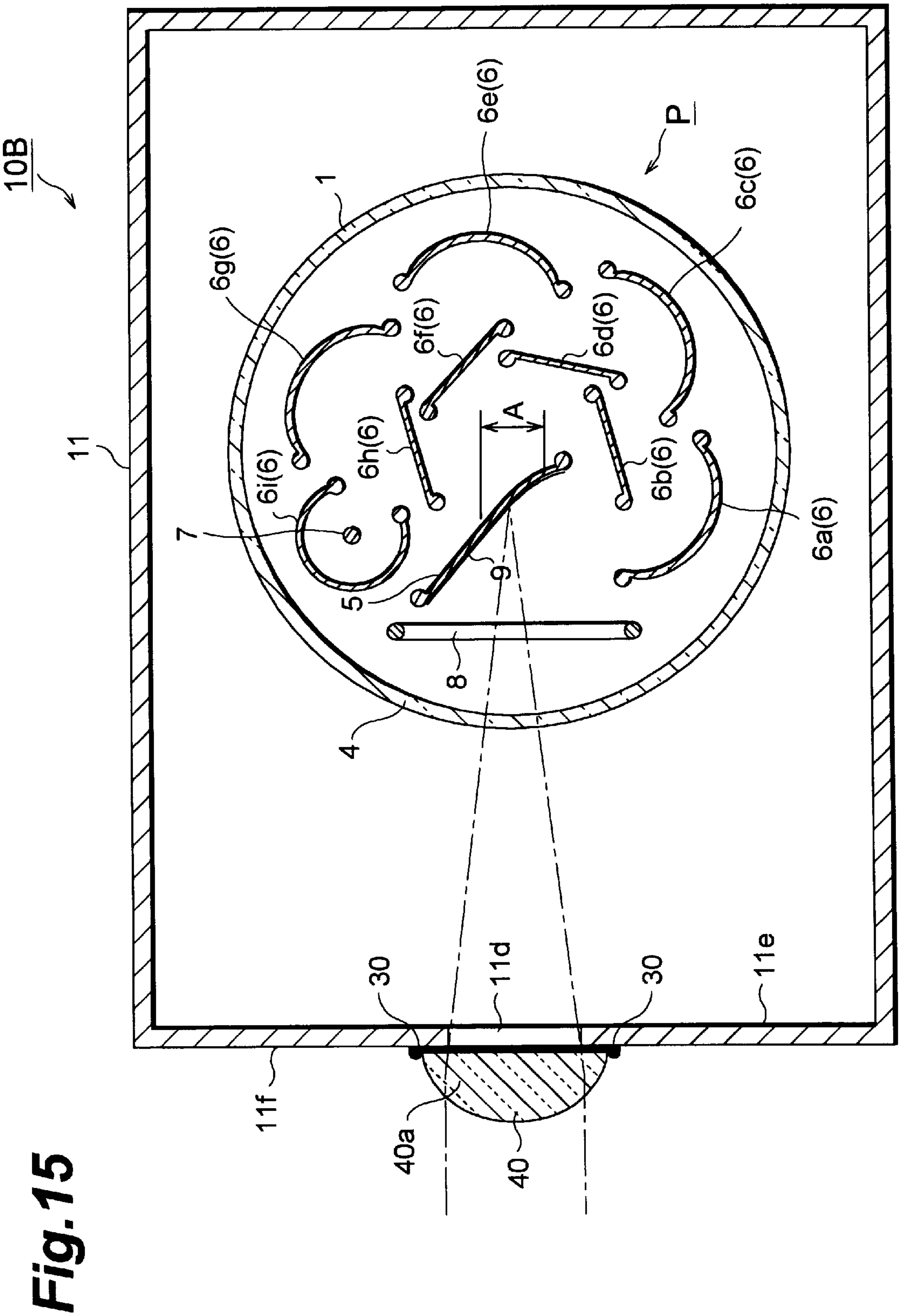
FIG. 15 is a sectional view, taken along line IV—IV, of the light detecting apparatus shown in FIG. 14.

Further, FIGS. 14 and 15 show a second modified example of the above-mentioned first embodiment. In this modified example, as with the first embodiment, a condenser lens 40 made of glass is secured to the housing 11 so as to close the rectangular entrance window 11*d* disposed at the front wall 11*c* of a magnetic shielding case 10B. This condenser lens 40 is a hemispherical lens having a spherically-curved lens surface 40*a*. This hemispherical lens 40 is secured to the outer wall face 11*f* of the housing 11 by means of an adhesive such the lens surface 40*a* is directed to the outside of the housing 11. Accordingly, the condenser lens 40 can be bonded to the housing 11 from the outside, thus facilitating the operations for positioning and securing the condenser lens 40.

The radius of curvature of the lens surface 40*a* in the hemispherical lens 40 is selected such that the light incident on the hemispherical lens 40 substantially forms a focal point in the effective region A of the photocathode 9. Also, when the hemispherical lens 40 is utilized, the collimated light to be detected can be collected into a spot-like form on the effective region A of the photocathode 9. Selected as the location of this spot-like collected light portion is the center part on the effective region A where the light receiving sensitivity (anode output) in the length directions is particularly high (See FIG. 11). When the light is thus substantially collected like a point, very weak light to be measured can securely be detected.

Here, the hemispherical lens 40 may be secured to the inner wall face 11*e* of the housing 11. In FIGS. 14 and 15, constituents identical or equivalent to those in the magnetic shielding case 10 of the above-mentioned first embodiment are referred to with marks identical thereto without their explanations being repeated.

The magnetic shielding case of the present invention should not be restricted to the above-mentioned examples, and the housing 11 may also have a cylindrical or prism-like form. Also, within the magnetic shielding case, the photomultiplier P may be positioned not only at the center of the housing 11 but also on its inner side farthest from the entrance window 11*d*. Further, although preferably made of glass, the condenser lens may be made of plastic.

Figure 16:
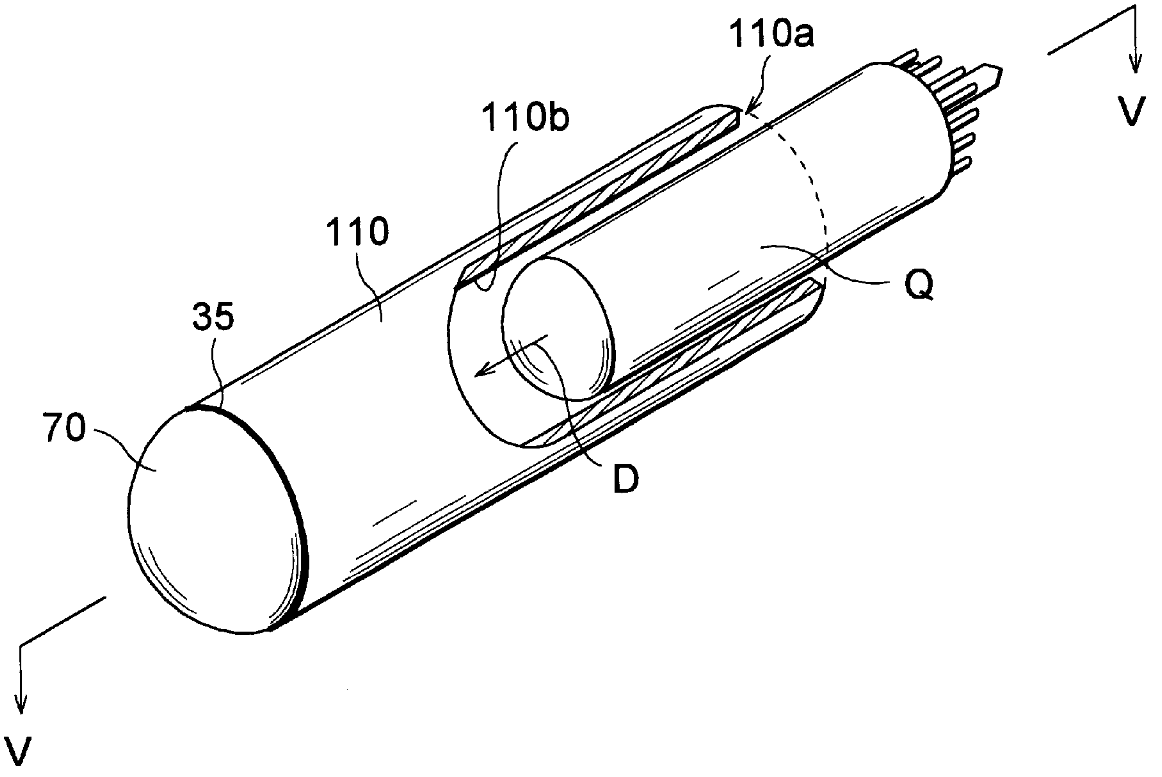
FIG. 16 is a view for explaining assembling steps of a second embodiment of the light detecting apparatus according to the present invention.
Figure 17:
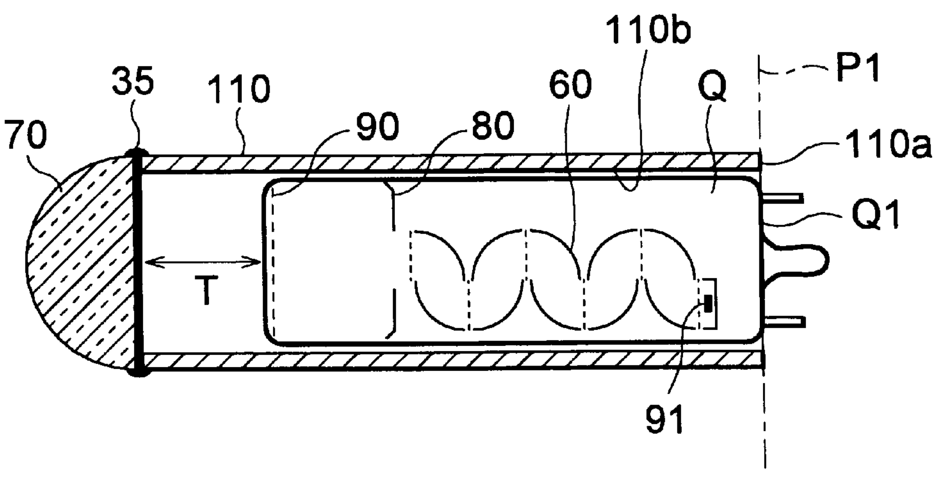
FIG. 17 is a sectional view, taken along line V—V, of the light detecting apparatus shown in FIG. 16.

FIGS. 16 and 17 show a second embodiment of the magnetic shielding case according to the present invention, and the light detecting apparatus, which includes the magnetic shielding case and the photomultiplier housed within the magnetic shielding case. In this embodiment, a head-on type photomultiplier Q having a transmission type photocathode is employed. Also, its housing (magnetic shielding main body) 110 has a cylindrical form. Secured to one of the openings of this housing 110 by means of an adhesive 35 is a hemispherical lens 70, whereas the photomultiplier Q is accommodated into the housing 110 through the other opening along the direction indicated by arrow D in FIG. 16.

As shown in FIG. 17, the head-on type photomultiplier Q comprises a transmission type photocathode 90, a focusing electrode 80, an electron multiplying section 60, and an anode 91.

In the magnetic shielding case of the second embodiment, in order to define the distance between the photomultiplier Q and the hemispherical lens 70, an opening end 110*a* of the housing 110 functions as a positioning structure. Namely, when the photomultiplier Q is secured into the housing 110 such that a plane P1 including the opening end 110*a* is made flush with the bottom surface Q1 of the photomultiplier Q, the influence of magnetism resulting from the existence of the opening through which light enters can be effectively suppressed. Therefore, the inner wall 110*b* and the opening end 110*a* are included in the positioning structure.

As explained in the foregoing, in accordance with the present invention, the housing has an entrance window at a position facing the light incident portion of the sealed envelope, whereas a condenser lens is disposed so as to close this entrance window. Since this condenser lens can be disposed at a position by which incident light can be collected onto an effective region of the photocathode of the photomultiplier having a high sensitivity, the uniformity in light receiving sensitivity of the photomultiplier can be improved, and the magnetic shielding effect enhanced. Also, the present invention's very remarkable advantages lie in that the uniformity in light receiving sensitivity of the photomultiplier is dramatically improved by a very simple structure in which a condenser lens is bonded and secured to a housing having a magnetic shielding effect.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 8-237018 (237018/1996) filed on Sep. 6, 1996 is hereby incorporated by reference.

What is claimed is:

1. A light detecting apparatus, comprising:

a photocathode provided to receive light from a light emitting source originating externally to said light detecting apparatus and to emit photoelectrons in accordance with the light detected;

an electron multiplying portion provided to multiply the photoelectrons from said photocathode;

an anode provided to collect electrons from said electron multiplying portion;

an envelope accommodating said photocathode, said electron multiplying portion and said anode; and a magnetically-shielding structure having:

a housing made of a material magnetically shielding at least said photocathode while accommodating said envelope, said housing having a first opening for passing through the light to be detected toward said photocathode;

a lens element transparent to the light to be detected, supported by said housing so as to close said first opening and to direct light to said photocathode; and a positioning structure provided so as to place said envelope at a predetermined position so as to define a distance between said photocathode and said lens element.

2. A light detecting apparatus according to claim 1, wherein said positioning structure includes:

a lid portion, made of a material magnetically shielding at least said photocathode, attached to said housing, said lid portion defining a space accommodating said envelope together with said housing, and having an opening defining a position where said photocathode in said envelope is disposed; and a socket portion attached to said lid portion so as to close the opening of said lid portion, said socket portion supporting said envelope through the opening of said lid portion.

3. A light detecting apparatus according to claim 1, wherein said lens element includes a cylindrical lens.

4. A light detecting apparatus according to claim 1, wherein said lens element includes a hemispherical lens.

5. A light detecting apparatus according to claim 1, wherein said housing comprises a second opening arranged so as to face said first opening.

6. A light detecting apparatus according to claim 5, wherein said lens element includes a hemispherical lens.

7. A light detecting apparatus, comprising:

a photocathode provided to receive light from a light emitting source originating externally to said light detecting apparatus and to emit photoelectrons in accordance with the light detected;

an electron multiplying portion provided to multiply the photoelectrons from said photocathode;

an anode provided to collect electrons from said electron multiplying portion;

an envelope accommodating said photocathode, said electron multiplying portion, and said anode; and a magnetically shielding structure having:

a housing made of a material magnetically shielding at least said photocathode while accommodating said envelope, said housing having a first opening for passing through the light to be detected toward said photocathode;

a lens element transparent to the light to be detected, and being supported by said housing so as to close said first opening, said lens element having a convex portion directed inward of said housing and toward said photocathode; and a positioning structure provided so as to place said envelope at a predetermined position so as to define a distance between said photocathode and said lens element.

8. A light detecting apparatus, comprising:

a photocathode provided to receive light, said light originating externally to said light detecting apparatus and to emit photoelectrons in accordance with the light detected;

an electron multiplying portion provided to multiply the photoelectrons from said photocathode;

an anode provided to collect electrons from said electron multiplying portion;

an envelope accommodating said photocathode, said electron multiplying portion and said anode; and a magnetically-shielding structure having:

a housing made of a material magnetically shielding at least said photocathode while accommodating said envelope, said housing having a first opening for passing through the light to be detected toward said photocathode;

a lens element transparent to the light to be detected, supported by said housing so as to close said first opening and to direct light to said photocathode; and a positioning structure provided so as to place said envelope at a predetermined position so as to define a distance between said photocathode and said lens element.

* * * * *